(12) United States Patent
Park

(10) Patent No.: US 10,727,063 B2
(45) Date of Patent: Jul. 28, 2020

(54) METHODS OF FABRICATING HIGH VOLTAGE SEMICONDUCTOR DEVICES

(71) Applicant: SK hynix system ic Inc., Chungcheongbuk-do (KR)

(72) Inventor: Soon Yeol Park, Daejeon (KR)

(73) Assignee: SK hynix system ic Inc., Chungcheongbuk-do (KR)

( * ) Notice: Subject to any disclaimer, the term of this patent is extended or adjusted under 35 U.S.C. 154(b) by 0 days.

(21) Appl. No.: 16/276,310

(22) Filed: Feb. 14, 2019

(65) Prior Publication Data

US 2019/0378721 A1 Dec. 12, 2019

(30) Foreign Application Priority Data

Jun. 11, 2018 (KR) ........................ 10-2018-0066708

(51) Int. Cl.

| | |
|---|---|
| *H01L 21/266* | (2006.01) |
| *H01L 29/78* | (2006.01) |
| *H01L 29/10* | (2006.01) |
| *H01L 29/66* | (2006.01) |
| *H01L 29/40* | (2006.01) |
| *H01L 21/265* | (2006.01) |
| *H01L 21/28* | (2006.01) |
| *H01L 21/74* | (2006.01) |
| *H01L 29/423* | (2006.01) |

(52) U.S. Cl.
CPC ...... *H01L 21/266* (2013.01); *H01L 21/26513* (2013.01); *H01L 21/28114* (2013.01); *H01L 21/74* (2013.01); *H01L 29/1087* (2013.01); *H01L 29/1095* (2013.01); *H01L 29/408* (2013.01); *H01L 29/42376* (2013.01); *H01L 29/66681* (2013.01); *H01L 29/7816* (2013.01)

(58) Field of Classification Search
None
See application file for complete search history.

(56) References Cited

U.S. PATENT DOCUMENTS

| | | | | |
|---|---|---|---|---|
| 7,575,977 | B2 * | 8/2009 | Levin | H01L 21/823807 257/E21.427 |
| 9,941,171 | B1 * | 4/2018 | Yoo | H01L 21/823425 |
| 10,090,409 | B2 * | 10/2018 | McGregor | H01L 29/1095 |
| 2014/0070315 | A1 * | 3/2014 | Levy | H01L 29/0634 257/343 |
| 2017/0186856 | A1 * | 6/2017 | Han | H01L 21/26586 |

FOREIGN PATENT DOCUMENTS

| | | |
|---|---|---|
| KR | 1020100073282 | 7/2010 |
| KR | 100633994 | 10/2016 |

* cited by examiner

*Primary Examiner* — J. E. Schoenholtz
(74) *Attorney, Agent, or Firm* — IP & T Group LLP

(57) ABSTRACT

A method includes forming a blocking pattern on a buffer insulation layer disposed over a first region in a semiconductor region of a second conductivity type, forming an ion implantation mask pattern having an opening over the buffer insulation layer to expose the blocking pattern by the opening of the ion implantation mask pattern, and implanting impurity ions of a first conductivity type for forming a body region of the first conductivity type into the first region using the ion implantation mask pattern.

23 Claims, 9 Drawing Sheets

METHODS OF FABRICATING HIGH VOLTAGE SEMICONDUCTOR DEVICES

CROSS-REFERENCE TO RELATED APPLICATIONS

The present application claims priority under 35 U.S.C 119(a) to Korean Application No. 10-2018-0066708, filed on Jun. 11, 2018, which is herein incorporated by reference in its entirety.

BACKGROUND

1. Technical Field

Various embodiments of the present disclosure relate to high voltage semiconductor devices and, more particularly, to methods of fabricating high voltage semiconductor devices for suppressing a well proximity effect.

2. Related Art

Integrated circuits that are capable of performing both the functions of a controller and of a driver may be employed in smart power devices. Also, output circuits of the smart power devices may be designed to include lateral double diffused MOS (LDMOS) transistors operating at high voltages, as so called "a high voltage semiconductor device". Thus, breakdown voltages of the LDMOS transistors, for example, a drain junction breakdown voltage and a gate dielectric breakdown voltage are important factors that may directly influence the stable operation of the LDMOS transistors. In addition, an on-resistance (Ron) value of the LDMOS transistors may also be an important factor that may influence electrical characteristics of the LDMOS transistors, for example, a current drivability of the LDMOS transistors.

SUMMARY

In accordance with an embodiment, there is provided a method of fabricating a high voltage semiconductor device. The method includes forming a blocking pattern for blocking impurity ions over a buffer insulation layer disposed over a first region in a semiconductor region of a second conductivity type, forming an ion implantation mask pattern having an opening over the buffer insulation layer to expose the blocking pattern by the opening of the ion implantation mask pattern, and implanting impurity ions of a first conductivity type for forming a body region of the first conductivity type into the first region using the ion implantation mask pattern.

In accordance with another embodiment, there is provided a method of fabricating a high voltage semiconductor device. The method includes forming a first blocking pattern and a second blocking pattern, which are located to be spaced apart from each other to block impurity ions, over a buffer insulation layer disposed over a first region in a semiconductor region of a second conductivity type. An ion implantation mask pattern having an opening is formed over the buffer insulation layer to expose the first and second blocking patterns by the opening of the ion implantation mask pattern. Impurity ions for forming a body region of the first conductivity type are implanted into the first region using the ion implantation mask pattern. The first and second blocking patterns are removed after the impurity ions of the first conductivity type are implanted into the first region.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to methods of fabricating high voltage semiconductor devices.

One of various methods for improving an on-resistance (Ron) characteristic of the high voltage semiconductor device is to reduce a pitch size of the high voltage semiconductor device in a channel length direction of the high voltage semiconductor device. In such a case, a width of a body region of the high voltage semiconductor device may also be reduced. In case of an N-channel LDMOS transistor, a body region overlapping with a gate electrode may act as a channel region. Since a doping concentration of the channel region may directly influence a threshold voltage of the N-channel LDMOS transistor, it may be necessary to accurately control the doping concentration of the channel region. The doping concentration of the channel region in the body region may be dominantly influenced by an ion implantation process for forming the body region. The doping concentration of the channel region in the body region may undesirably increase due to a well proximity effect (NAPE) that occurs during an ion implantation process for forming the body region. The well proximity effect (WPE) refers to an effect which is due to a phenomenon occurring at the nanoscale level when impurity ions traveling toward a wafer are scattered by side surfaces of a photoresist pattern used as an ion implantation mask and side surfaces of a gate electrode to be implanted into unwanted regions. Various embodiments of the present disclosure will provide methods of fabricating high voltage semiconductor devices which are capable of suppressing a phenomenon that the doping concentration of the channel region in the body region undesirably increases due to the well proximity effect (WPE).

Figure 1:
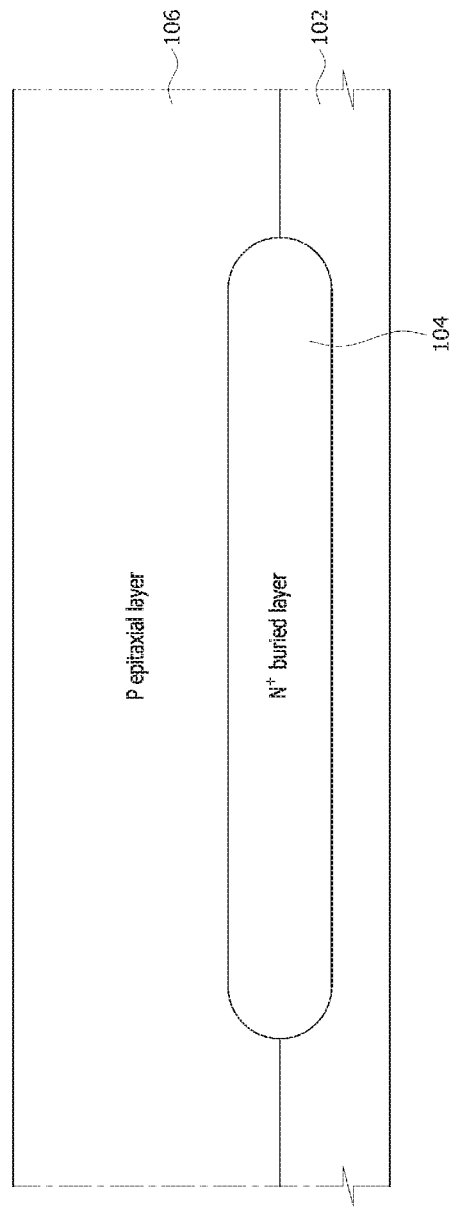
FIGS. 1 to 7 are cross-sectional views illustrating a method of fabricating a high voltage semiconductor device in accordance with an embodiment of the present disclosure.

FIGS. 1 to 7 are cross-sectional views illustrating a method of fabricating a high voltage semiconductor device in accordance with an embodiment of the present disclosure. Although the present embodiment is described in conjunction with a method of fabricating an N-channel high voltage semiconductor device, the present disclosure may also be equally applicable to a method of fabricating a P-channel high voltage semiconductor device with changing a conductivity type of each doped region into an opposite conductivity type. Referring to FIG. 1, a buried layer 104 having a second conductivity type, for example, an N-type buried layer may be formed on a portion of a substrate 102 of a first conductivity type, for example, a P-type substrate. In an embodiment, the substrate 102 may be a silicon substrate. A P-type epitaxial layer 106 may be formed on the substrate 102 to cover the buried layer 104. The buried layer 104 and the epitaxial layer 106 may be formed using well-known methods and materials in the art, hence, no further description is required.

Figure 2:
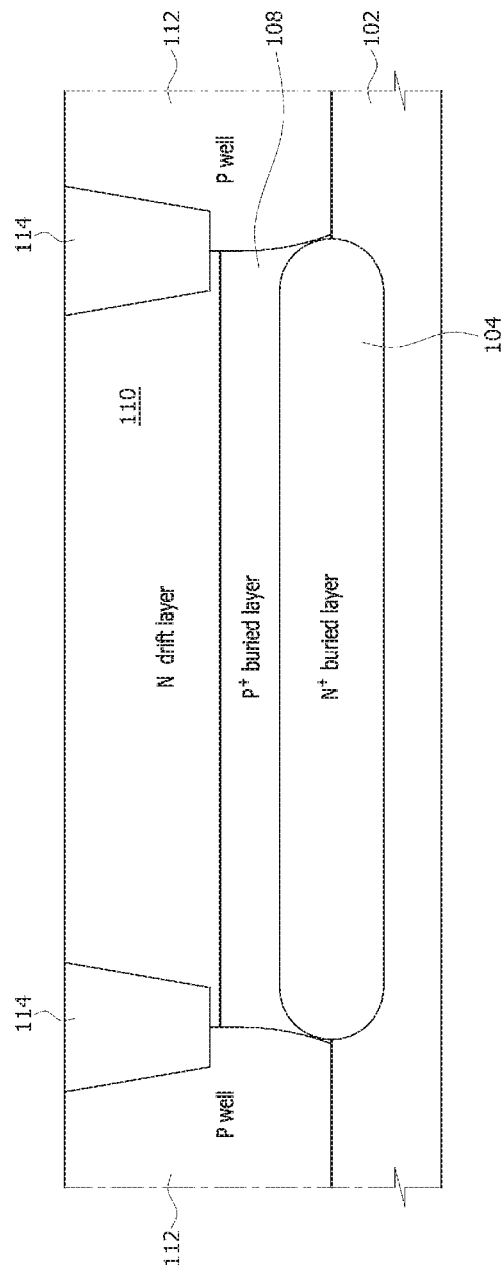

Referring to FIG. 2, a P-type buried layer 108 may be formed in a lower portion of the P-type epitaxial layer (106 of FIG. 1). An N-type semiconductor region, that is, an N-type drift region 110 may be formed in an upper portion of the P-type epitaxial layer (106 of FIG. 1). Next, a P-type well region 112 penetrating the N-type drift region 110 and the P-type buried layer 108 may be formed. In an embodiment, the P-type well region 112 may be formed such that a bottom surface of the P-type well region 112 is in contact with a top surface of the substrate 102. The P-type well region 112 may act as an isolation region that electrically and physically isolates a high voltage semiconductor device to be fabricated in accordance with the present embodiment from other devices adjacent to the high voltage semiconductor device. A device isolation layer 114 may then be formed in the P-type well region 112. In an embodiment, the device isolation layer 114 may be formed using a trench isolation process.

Figure 3:
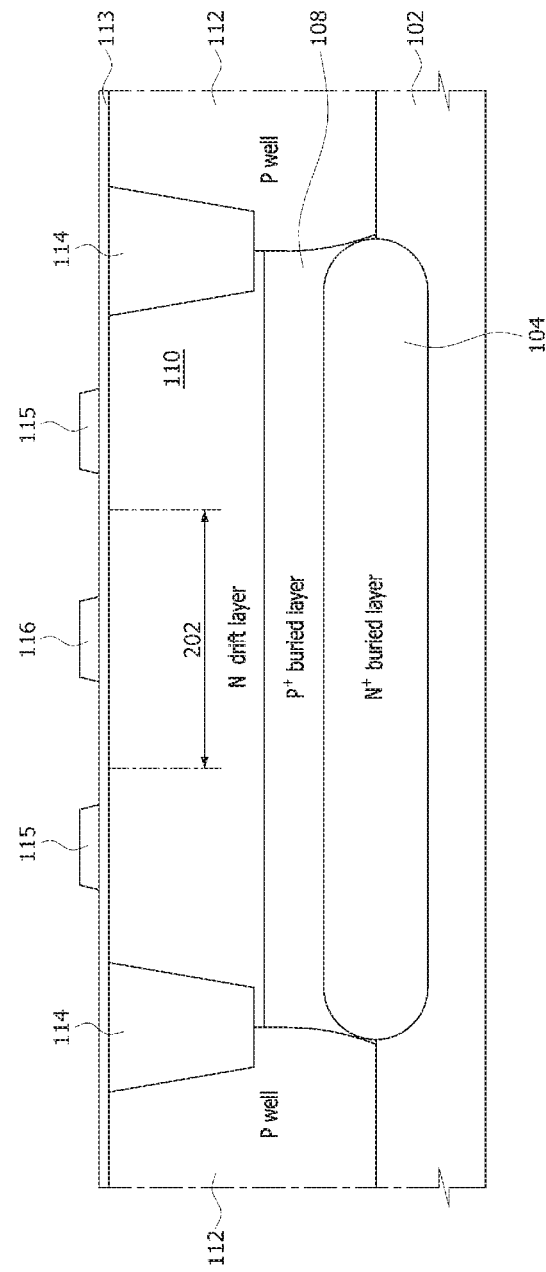

Referring to FIG. 3, an insulation layer 113 may be formed on the surfaces of the N-type drift region 110, the P-type well region 112 and the device isolation layer 114. The insulation layer 113 may function as a buffer layer during an ion implantation process. In addition, the insulation layer 113 may also be used as a gate insulation layer. In an embodiment, the insulation layer 113 may be formed of an oxide layer. A field plate insulation pattern 115 and a blocking pattern 116 may be formed on the insulation layer 113. The blocking pattern 116 may be formed to be located on a first region 202 where a body region is formed in a subsequent process. The first region 202 may be positioned centrally in a region defined by the device isolation layer 114. The field plate insulation pattern 115 may be formed to be located on a region between the first region 202 and the device isolation layer 114. Both of the field plate insulation pattern 115 and the blocking pattern 116 may be formed to have a planar structure. That is, a bottom surface of the field plate insulation pattern 115 may be coplanar with a bottom surface of the blocking pattern 116 and may also be coplanar with a top surface of the insulation layer 113. A top surface of the field plate insulation pattern 115 may be coplanar with a top surface of the blocking pattern 116. In an embodiment, the field plate insulation pattern 115 and the blocking pattern 116 may be formed of the same material layer, for example, an oxide layer. In an embodiment, the field plate insulation pattern 115 and the blocking pattern 116 may be formed by the same deposition process and the same patterning process. More specifically, an insulation material layer may be deposited on the insulation layer 113, and a mask pattern may be formed on the insulation material layer. The insulation material layer may be patterned by a patterning process including an etch process performed using the mask pattern as an etch mask, thereby simultaneously forming the field plate insulation pattern 115 and the blocking pattern 116. In another embodiment, the field plate insulation pattern 115 and the blocking pattern 116 may be separately formed. In such a case, after the field plate insulation pattern 115 is formed, the blocking pattern 116 may be formed using another deposition process and another patterning process.

Figure 4:
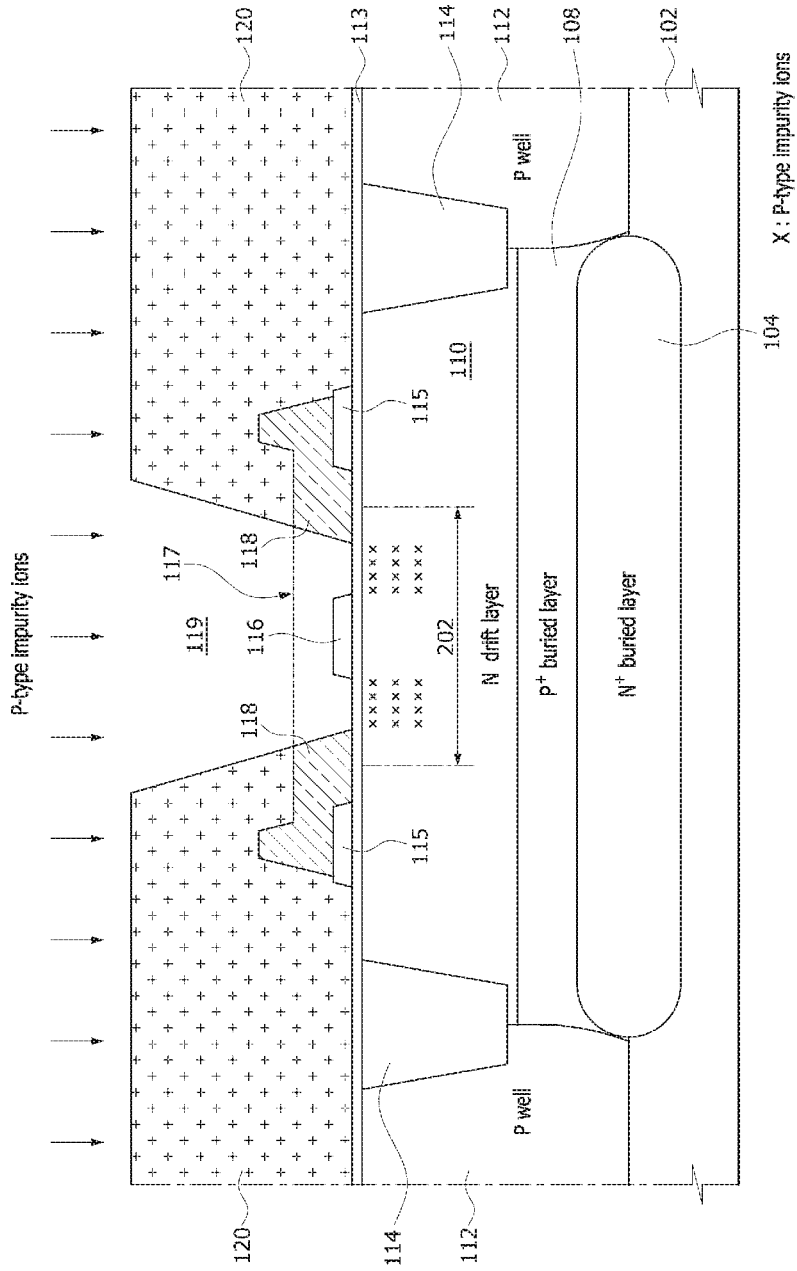

Referring to FIG. 4, a gate electrode 118 and a photoresist pattern 120 may be formed on the field plate insulation pattern 115 and the insulation layer 113. For example, a conductive layer may be formed on the insulation layer 113 to cover the field plate insulation pattern 115 and the blocking pattern 116, and the conductive layer may be patterned to form a gate pattern 117 covering the field plate insulation pattern 115, the blocking pattern 116, and the insulation layer 113 between the field plate insulation pattern 115 and the blocking pattern 116. In an embodiment, the field plate insulation pattern 115 may be formed to have a closed loop shape such as a ring-shaped pattern when viewed from a plan view. In such a case, the blocking pattern 116 may be surrounded by and spaced apart from the field plate insulation pattern 115. Subsequently, the photoresist pattern 120 may be formed on the insulation layer 113 to expose a central region of the gate pattern 117 and to cover an edge of the gate pattern. The central portion of the gate pattern 117 may then be etched using the photoresist pattern 120 as an etch mask to form the gate electrode 118 providing an opening 119 that exposes the blocking pattern 116 and a portion of the insulation layer 113 adjacent to the blocking pattern 116. The insulation layer 113 and the field plate insulation pattern 115 which are vertically overlapping with the gate electrode 118 may act as a gate insulation layer. In an embodiment, the gate electrode 118 may be formed of a doped polysilicon layer. The photoresist pattern 120 may be formed to provide the opening 119 that exposes a portion of the insulation layer 113 on the first region 202 where a body region is formed in a subsequent process. Side surfaces of the photoresist pattern 120 exposed by the opening 119 may have a positive sloped profile. A width (e.g., a diameter in a plan view) of the opening 119 may be gradually reduced toward the substrate 102 because of the positive sloped profile of the side surfaces of the opening 119.

The side surfaces of the photoresist pattern 120 defining the opening 119 may be aligned with inner side surfaces of the gate electrode 118. Thus, the inner side surfaces of the gate electrode 118 and the side surfaces of the photoresist pattern 120 may be exposed by the opening 119. As described above, the opening 119 may be provided by etching the central portion of the gate pattern 117 covering the insulation layer 113 and the blocking pattern 116 on the first region 202 with an etch process performed using the photoresist pattern 120 as an etch mask to form the gate electrode 118. In such a case, the inner side surfaces of the gate electrode 118 may also have a positive sloped profile. Although not illustrated in the drawings, a thin insulation layer may be disposed on the inner side surfaces of the gate electrode 118 exposed by the opening 119. As indicated by arrows in FIG. 4, P-type impurity ions may be implanted into the first region 202 using the gate electrode 118 and the photoresist pattern 120 as implantation masks to form a P-type body region. In an embodiment, the P-type impurity ions may be implanted in a direction that is perpendicular to a surface of the substrate 102. In an embodiment, the P-type impurity ions may be boron (B) ions. As a result of the ion implantation of the P-type impurity ions, a doped region may be formed in the first region 202 of the N-type drift region 110.

Figure 5:
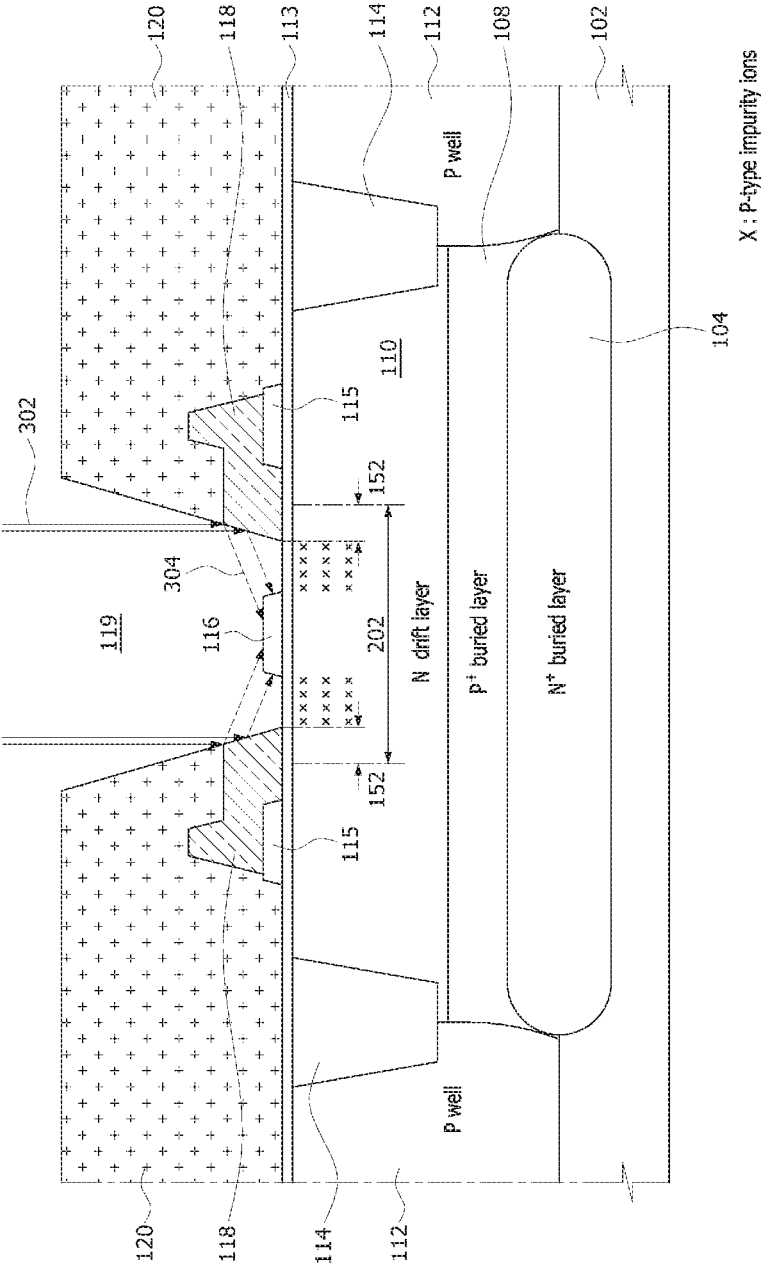

As more specifically illustrated in FIG. 5, the blocking pattern 116 may suppress a phenomenon that a doping concentration of a second region 152 increases due to the well proximity effect (WPE) during the ion implantation process for forming a P-type body region. The second region 152 means a channel region which is located in the P-type body region to vertically overlap with the gate electrode 118. Specifically, as illustrated in FIG. 5, the P-type impurity ions 302 travelling toward the sloped inner side surfaces of the gate electrode 118 or the sloped side surfaces of the photoresist pattern 120 may reflect on the sloped inner side surfaces of the gate electrode 118 or the sloped side surfaces of the photoresist pattern 120 to be scattered toward the second region 152 (see arrows 304). In the present embodiment, the blocking pattern 116 may be located in paths 304 that the scattered P-type impurity ions travel toward the second region 152, thereby preventing the scattered P-type impurity ions from being implanted into the second region 152. After the P-type impurity ions are implanted into the first region 202, the photoresist pattern 120 and the blocking pattern 116 may be removed. Although not illustrated in the drawings, N-type impurity ions may be additionally implanted into the second region 152 to more precisely adjust a threshold voltage of the high voltage semiconductor device after the P-type impurity ions for forming the P-type body region are implanted.

Figure 6:
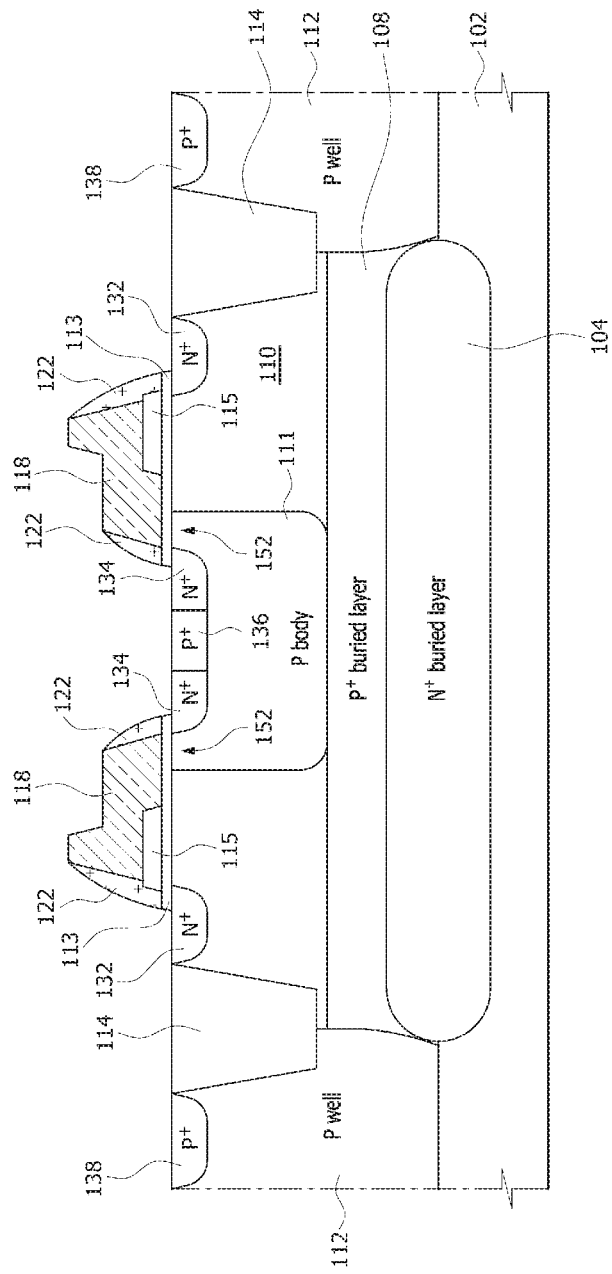

Referring to FIG. 6, the P-type impurity ions implanted into the first region 202 may be diffused using a diffusion process to form a P-type body region 111. After the P-type body region 111 is formed, a gate sidewall spacer 122 may be formed on the side surfaces of the gate electrode 118. Subsequently, N-type impurity ions may be implanted with an appropriate ion implantation mask, and P-type impurity ions may be implanted with another appropriate ion implantation mask. Thereafter, a diffusion process may be performed to simultaneously form an N-type drain region 132 in the N-type drift region 110 as well as a P-type source contact region 136 and an N-type source region 134 in the P-type body region 111. In addition, a P-type well contact region 138 may also be formed in the P-type well region 112 during the diffusion process. In another embodiment, the N-type impurity ions for forming the N-type drain region 132 and the N-type source region 134 may be diffused by a first diffusion process, and the P-type impurity ions for forming the P-type source contact region 136 and the P-type well contact region 138 may be diffused by a second diffusion process different from the first diffusion process.

Figure 7:
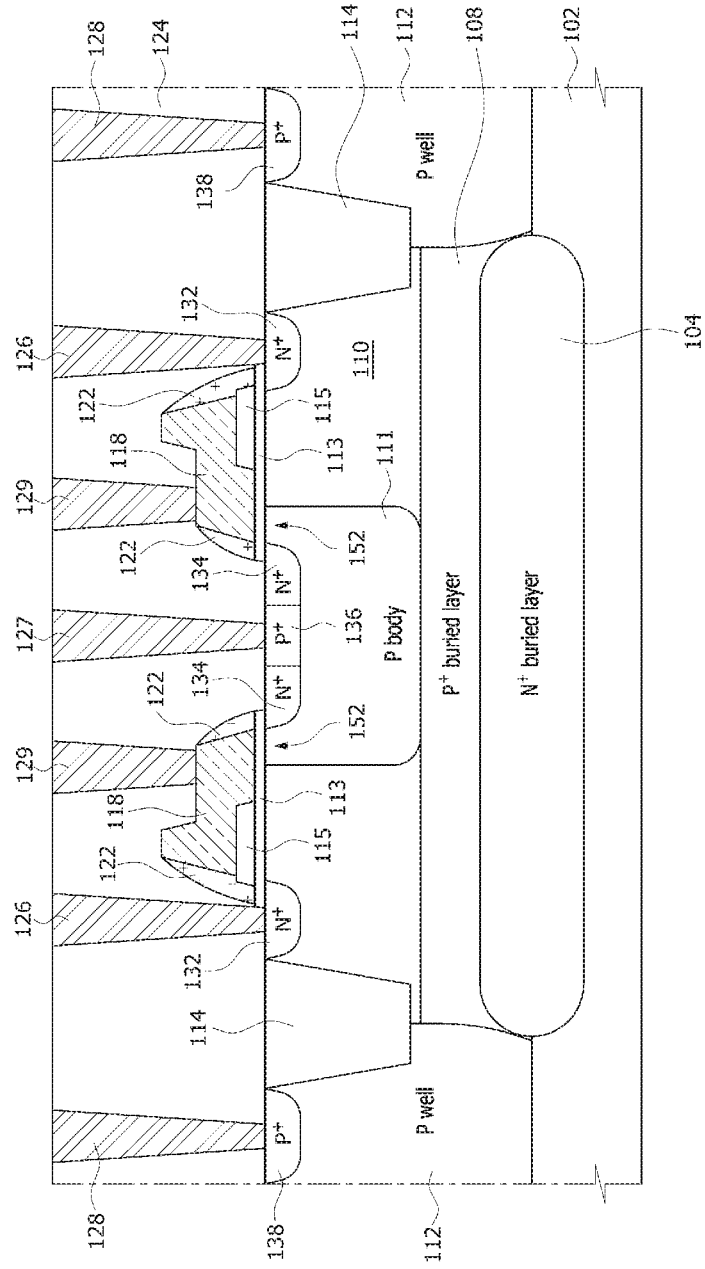

Referring to FIG. 7, an interlayer insulation layer 124 may be formed on an entire surface of a substrate including the N-type drain region 132, the N-type source region 134, the P-type source contact region 136 and the P-type well contact region 138. The interlayer insulation layer 124 may be patterned to form contact holes that expose the N-type drain region 132, the P-type source contact region 136, the P-type well contact region 138 and the gate electrode 118. Subsequently, the contact holes may be filled with a conductive layer to form a drain contact 126, a source contact 127, a well contact 128 and a gate contact 129. Although not illustrated in the drawings, a silicide layer may be formed on the N-type drain region 132, the P-type source contact region 136, the P-type well contact region 138 and the gate electrode 118 before the interlayer insulation layer 124 is formed.

Figure 8:
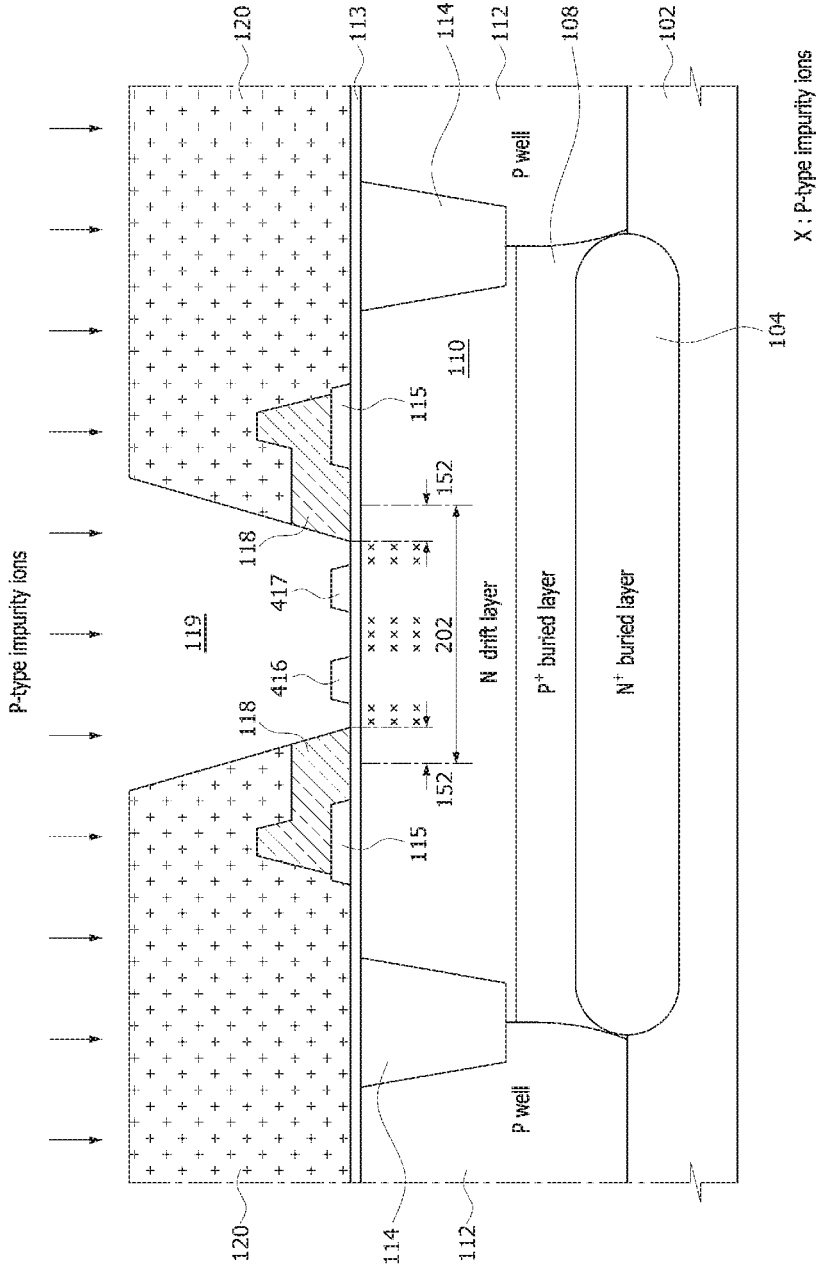
FIGS. 8 and 9 are cross-sectional views illustrating a method of fabricating a high voltage semiconductor device in accordance with an embodiment of the present disclosure.
Figure 9:
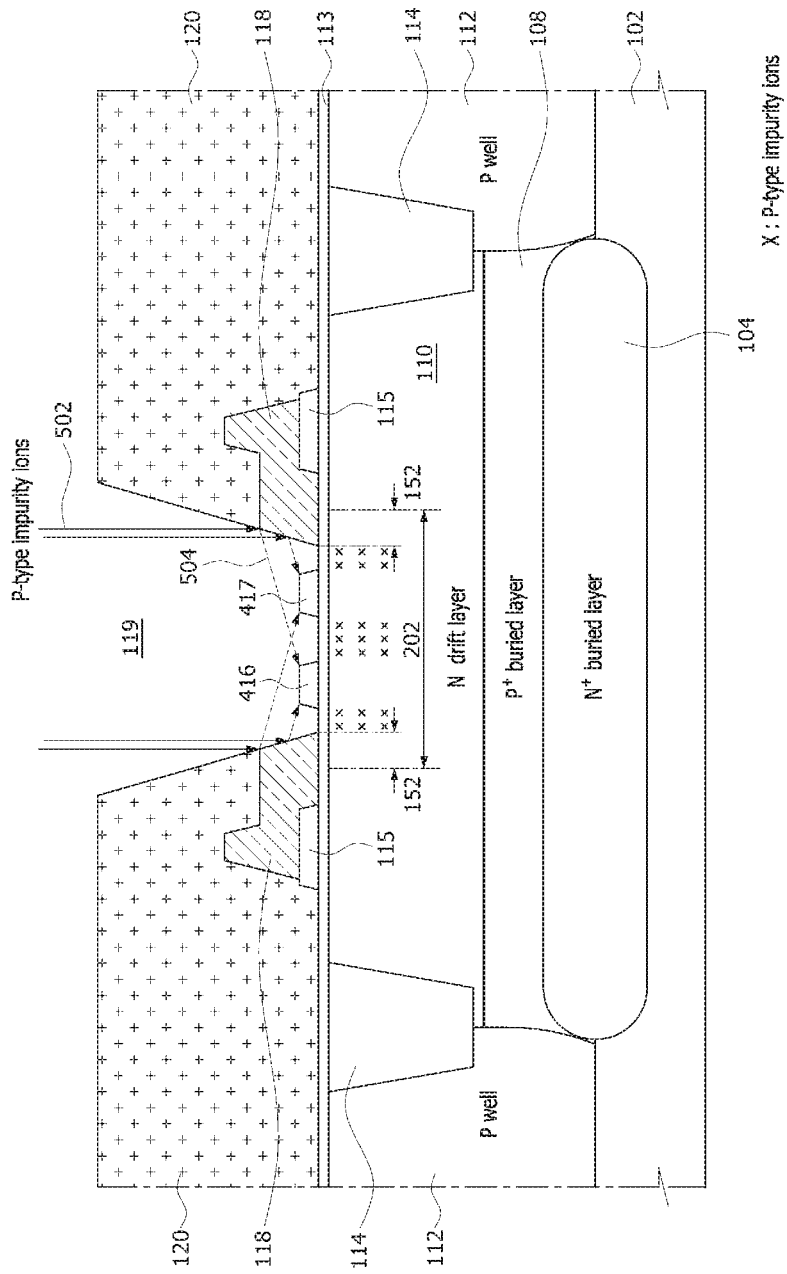

FIGS. 8 and 9 are cross-sectional views illustrating a method of fabricating a high voltage semiconductor device in accordance with another embodiment of the present disclosure. In FIGS. 8 and 9, the same reference numerals as used in FIGS. 1 to 7 denote the same elements. Thus, detailed descriptions of the same elements as set forth with reference to FIGS. 1 to 7 are omitted hereinafter to avoid a repeated description. Referring to FIGS. 8 and 9, in accordance with the present embodiment, a first blocking pattern 416 and a second blocking pattern 417 may be formed on the insulation layer 113 on the first region 202 where the P-type body region 111 is formed in a subsequent process. That is, the first blocking pattern 416 and the second blocking pattern 417 instead of the blocking pattern 116 illustrated in FIG. 3 may be formed on the insulation layer 113 on the first region 202. Accordingly, the present embodiment differs from the previous embodiment illustrated in FIGS. 1 to 7 in terms of the number of the blocking patterns. The first blocking pattern 416 and the second blocking pattern 417 may be formed to be spaced apart from each other in a channel length direction (i.e., in a horizontal direction in FIGS. 8 and 9). The first blocking pattern 416 and the second blocking pattern 417 may also be formed to be spaced apart from the gate electrode 118. As illustrated in FIG. 9, while the P-type impurity ions for forming the P-type body region (111 of FIGS. 6 and 7) are implanted, the P-type impurity ions 502 travelling toward the sloped inner side surfaces of the gate electrode 118 or the sloped side surfaces of the photoresist pattern 120 may be scattered by the sloped inner side surfaces of the gate electrode 118 or the sloped side surfaces of the photoresist pattern 120 to travel toward the second region 152 (see broken line arrows 504). In the present embodiment, the first and second blocking patterns 416 and 417 may be located in paths 504 that the scattered P-type impurity ions travel toward the second region 152, thereby preventing the scattered P-type impurity ions from being implanted into the second region 152. This way formation of regions of increased P-type impurity concentration is prevented.

In accordance with the embodiments described above, at least one blocking pattern may be formed over a body region to be formed by a subsequent process before an ion implantation process for forming the body region is performed, thereby preventing a doping concentration of a channel region in the body region from undesirably increasing due to a well proximity effect (WPE) while the ion implantation process for forming the body region is performed.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of fabricating a high voltage semiconductor device, the method comprising:
    forming a blocking pattern for blocking impurity ions over a buffer insulation layer disposed over a first region in a semiconductor region of a second conductivity type;
    forming an ion implantation mask pattern having an opening over the buffer insulation layer entirely to expose the blocking pattern by the opening of the ion implantation mask pattern; and implanting impurity ions of a first conductivity type for forming a body region of the first conductivity type into the first region using the ion implantation mask pattern.

2. The method of claim 1, wherein the ion implantation mask pattern is comprised of a gate electrode and a photoresist pattern covering the gate electrode.

3. The method of claim 2, wherein side surfaces of the gate electrode and the photoresist pattern exposed by the opening have a sloped profile.

4. The method of claim 3, further comprising forming a field plate insulation pattern on the semiconductor region to vertically overlap with the gate electrode;

and removing the blocking pattern after the impurity ions of the first conductivity type are implanted into the first region.

5. The method of claim 4, wherein the field plate insulation pattern and the blocking pattern are formed using the same deposition process and the same patterning process.

6. The method of claim 4, wherein the field plate insulation pattern and the blocking pattern are formed of the same material layer.

7. The method of claim 6, wherein the field plate insulation pattern and the blocking pattern are formed of an oxide layer.

8. The method of claim 4, wherein the field plate insulation pattern and the blocking pattern are formed to have a planar structure.

9. The method of claim 1, wherein the blocking pattern is located to block impurity ions that are scattered by side surfaces of the ion implantation mask pattern exposed by the opening to travel toward a second region corresponding to edges of the first region.

10. The method of claim 1, wherein the blocking pattern is formed of an oxide layer.

11. The method of claim 1, wherein the blocking pattern is formed to have a planar structure.

12. The method of claim 1, wherein forming the blocking pattern is preceded by:
sequentially forming a buried layer of the second conductivity type and an epitaxial layer of the first conductivity type over a substrate of the first conductivity type;
forming the semiconductor region of the second conductivity type and a buried layer of the first conductivity type in an upper portion and a lower portion of the epitaxial layer of the first conductivity type, respectively;
forming a well region of the first conductivity type penetrating the semiconductor region of the second conductivity type and the buried layer of the first conductivity type; and
forming a device isolation layer at a boundary region between the well region of the first conductivity type and the semiconductor region of the second conductivity type.

13. The method of claim 1, wherein the semiconductor region of the second conductivity type acts as a drift region.

14. A method of fabricating a high voltage semiconductor device, the method comprising:
forming a first blocking pattern and a second blocking pattern, which are located to be spaced apart from each other to block impurity ions, over a buffer insulation layer disposed over a first region in a semiconductor region of a second conductivity type;
forming an ion implantation mask pattern having an opening over the buffer insulation layer to expose the first and second blocking patterns by the opening of the ion implantation mask pattern;
implanting impurity ions of a first conductivity type for forming a body region of the first conductivity type into the first region using the ion implantation mask pattern; and
removing the first and second blocking patterns after the impurity ions of the first conductivity type are implanted into the first region.

15. The method of claim 14, wherein the ion implantation mask pattern is comprised of a gate electrode and a photoresist pattern covering the gate electrode.

16. The method of claim 15, wherein side surfaces of the gate electrode and the photoresist pattern exposed by the opening have a sloped profile.

17. The method of claim 16, further comprising forming a field plate insulation pattern over the semiconductor region to vertically overlap with the gate electrode.

18. The method of claim 17, wherein the field plate insulation pattern, the first blocking pattern and the second blocking pattern are formed using the same deposition process and the same patterning process.

19. The method of claim 17, wherein the field plate insulation pattern, the first blocking pattern and the second blocking pattern are formed of the same material layer.

20. The method of claim 19, wherein the field plate insulation pattern, the first blocking pattern and the second blocking pattern are formed of an oxide layer.

21. The method of claim 17, wherein the field plate insulation pattern, the first blocking pattern and the second blocking pattern are formed to have a planar structure.

22. The method of claim 14, wherein the first and second blocking patterns are located to block impurity ions that are scattered by side surfaces of the ion implantation mask pattern exposed by the opening to travel toward a second region corresponding to edges of the first region.

23. The method of claim 14, wherein the semiconductor region of the second conductivity type acts as a drift region.

* * * * *